United States Patent [19]

Santilli

[11] 4,361,795

[45] Nov. 30, 1982

[54] BATTERY CHARGER POLARITY CIRCUIT CONTROL

[76] Inventor: Raymond R. Santilli, P.O. Box 26963, Oklahoma City, Okla. 73126

[21] Appl. No.: 191,216

[22] Filed: Sep. 26, 1980

Related U.S. Application Data

[63] Continuation-in-part of Ser. No. 906,172, May 15, 1978, abandoned.

[51] Int. Cl.³ .............................. H02J 7/00; H02J 7/10
[52] U.S. Cl. ........................................ 320/26; 320/59; 320/DIG. 2; 361/246
[58] Field of Search .................... 320/25, 26, 57, 59, 320/DIG. 2; 361/246, 245

[56] References Cited

U.S. PATENT DOCUMENTS

| | | | |
|---|---|---|---|
| 3,118,101 | 1/1964 | Arber | 320/26 |
| 3,273,039 | 9/1966 | Godshalk et al. | 361/246 X |
| 3,406,318 | 10/1968 | Harland, Jr. et al. | 317/43 |
| 3,413,487 | 11/1968 | Gershen | 307/127 |

Primary Examiner—Robert J. Hickey
Attorney, Agent, or Firm—Robert K. Rhea

[57] ABSTRACT

A normally open polarity sensing circuit is interposed between the charging current output of a battery charger and battery terminal clamps connected with a rechargeable storage battery. Normally open reed switches, closed by battery positive terminal potential, gates silicon controlled recitifiers for battery charging current flow according to the polarity of the battery.

3 Claims, 1 Drawing Figure

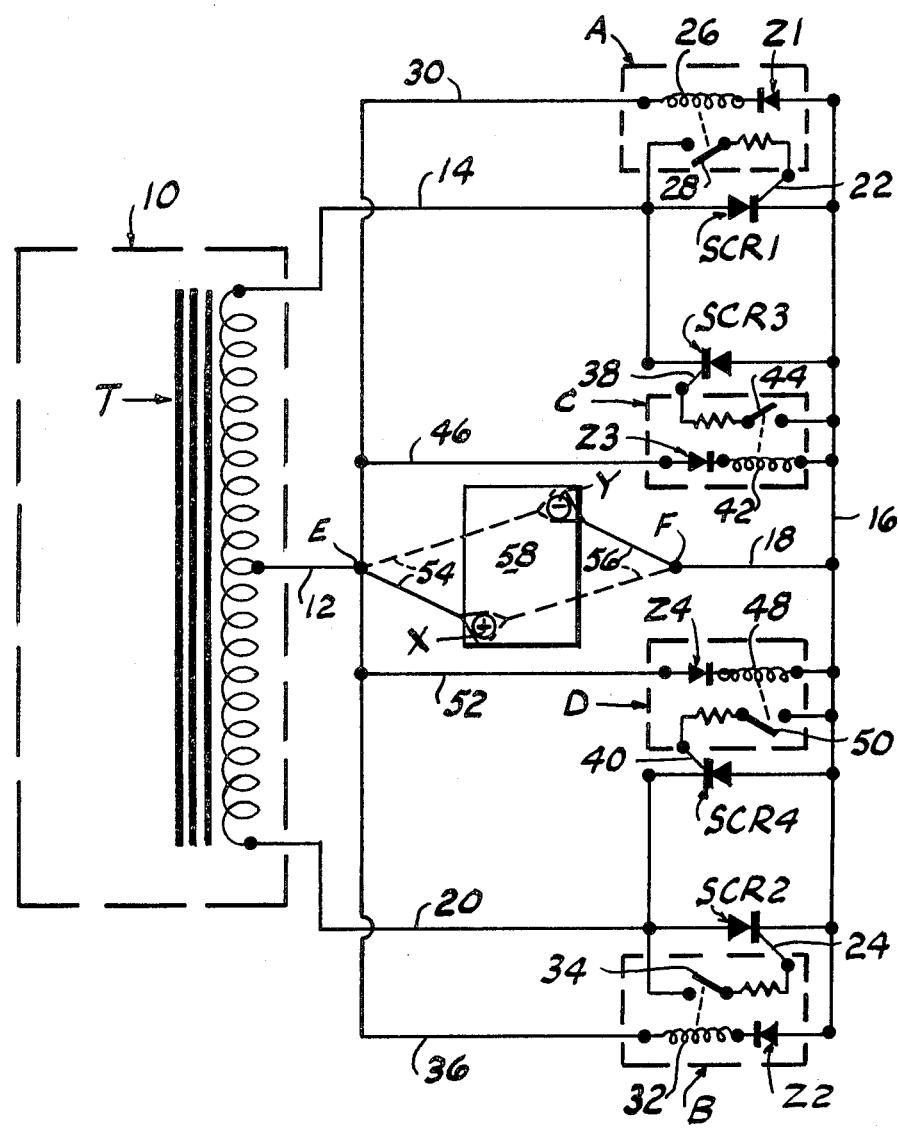

BATTERY CHARGER POLARITY CIRCUIT CONTROL

CROSS REFERENCE TO RELATED APPLICATION

This application is a continuation-in-part of an application filed in the United States Patent and Trademark Office on May 15, 1978, Ser. No. 906,172, now abandoned, entitled BATTERY CHARGER POLARITY CIRCUIT CONTROL.

BACKGROUND OF THE INVENTION

1. Field of the Invention

The present invention relates to battery chargers and more particularly to an automatic polarity current control for charging rechargeable storage batteries.

This invention provides a storage battery polarity sensing circuit to be connected between a battery charger and the battery terminals without consideration of the polarity of the battery. This feature is desirable for the reason that regardless of the position of the battery cable clamps, when connected to the battery terminals, it is impossible to reverse charge the battery. This circuit also provides a safety feature in which no current is present at the battery terminal clamps until the battery cable clamps are connected with battery terminals. When battery charging terminal clamps are connected with a battery, as little as 2 volts potential from the battery positive terminal will energize this polarity circuit to match the polarity of the charging current with the polarity of the battery.

2. Description of the Prior Art

The most pertinent prior patents are believed to be U.S. Pat. Nos. 3,118,101; 3,406,318 and 3,413,487.

U.S. Pat. No. 3,118,101 discloses a bi-stable relay interposed in a circuit and normally energized and closed with primary contacts by rectified current from a transformer secondary winding for charging a storage battery in which residual battery current actuates the bi-stable relay to close with secondary contacts in the event the battery charging positive and negative cables are reverse polarity connected with the terminals of the battery.

The circuit of U.S. Pat. No. 3,406,318 features the inclusion of an impedance element in series with a field discharge diode to provide reverse polarity protection and prevent the destruction of a field switching transistor when a reverse polarity current is applied across the circuit.

The circuit of U.S. Pat. No. 3,413,487 features a pair of double-pole single throw relays connected in series with a respective diode across input terminals for storage battery potential closing of one or the other of the relays with its contacts and applying current to a storage battery in accordance with its polarity.

The circuit of this invention is distinctive over the circuits of the above named patents by utilizing the secondary winding of a transformer for charging a storage battery in accordance with the battery polarity which employs a plurality of silicon controlled rectifiers for rectifying the direction of current applied to the battery. The silicon controlled rectifiers are gated open in accordance with the polarity of residual potential of a connected storage battery by a like plurality of reed switches respectively connected with the gate of the respective silicon controlled rectifier.

This application is distinctive over the above referred to pending application by the inclusion of the manner in which the reed switches are connected with the respective end and center tap of the transformer secondary winding.

SUMMARY OF THE INVENTION

One battery charging cable is center tapped to the secondary winding of a conventional battery charger transformer. The other battery charging cable is connected with a conductor bridging the end taps of the transformer secondary winding through two pairs of silicon controlled rectifiers (SCR's). A like number of reed switches connect the gate of each SCR to its anode lead. When the battery charging cable clamps are respectively connected with the positive and negative terminals of the battery, residual battery current will close two reed switches to fire the gate of one SCR in each pair of SCR's, respectively, thereby allowing charging current flow in one direction. The other SCR in each respective pair of SCR's are reverse connected, thereby blocking current in an opposite direction. If the battery charging cable clamps positions are reversed on the battery terminals, battery current will close the other two reed switches, to fire the gate of the other SCR of each respective pair, thereby allowing charging current flow in the opposite direction, the said one SCR of each pair of SCR's blocking current in said one direction.

The principal object of this invention is to provide a normally open residual battery current energized solid state polarity correcting battery charging circuit for charging a storage battery regardless of the connected position of the positive and negative charging cable clamps on the battery terminals.

BRIEF DESCRIPTION OF THE DRAWINGS

The single FIGURE is a wiring diagram.

DESCRIPTION OF THE PREFERRED EMBODIMENT

Like characters of reference designate like parts in those figures of the drawings in which they occur.

In the drawings:

The reference numeral 10 indicates a conventional battery charger having the secondary winding of its charging current output transformer T center tapped by a lead 12 to provide a terminal E. One end of the secondary winding of the transformer T is connected by a lead 14 to the anode of a first silicon controlled rectifier SCR1 with the cathode of SCR1 connected with a conductor 16. A lead 18, connected with a medial portion of the conductor 16, forms a contact F. The other end of the secondary winding of the transformer T is connected by a lead 20 to the anode of a second silicon controlled rectifier SCR2. The cathode of SCR2 is connected with the conductor 16. A first pair of normally open magnetic reed switches A and B respectively connect the lead 14 to the gate 22 of SCR1 and the lead 20 to the gate 24 of SCR2.

The coil 26 of the reed switch A, which, when energized, closes the armature 28 of its switch with its contact, is connected at one end to the terminal E by a lead 30. The other end of the coil 26 is connected with the cathode of a diode Z1 having its anode connected with the conductor 16. Similarly, the coil 32 of the reed switch B which, when energized, closes its switch armature 34 with its contact, is connected at one end to the terminal E by a lead 36. The other end of the coil 32 is connected with the cathode of a diode Z2 having an anode connected with the conductor 16.

A third silicon controlled rectifier SCR3 has its anode connected with the conductor 16 and its cathode connected with the lead 14. A fourth silicon controlled rectifier SCR4 has its anode connected with the conductor 16 and its cathode connected with the lead 20. A second pair of normally open magnetic reed switches C and D respectively connect the conductor 16 with the gate 38 of SCR3 and the conductor 16 with the gate 40 of SCR4.

The coil 42, of the reed switch C, which, when energized, closes its switch armature 44 with its contact, is connected at one end with the conductor 16. The other end of the coil 42 is connected with the cathode of a third diode Z3 having its anode connected to the terminal E by a lead 46. Similarly, the coil 48, of the reed switch D which, when energized, closes its switch armature 50 with its contact, is connected at one end with the conductor 16. The other end of the coil 48 is connected with the cathode of a fourth diode Z4 having its anode connected to the terminal E by a lead 52. A suitable resistor (not numbered) is connected in series between the respective reed switch and gate of the respective SCR.

The terminal E is connected with one end of a first battery charging positive cable 54. The terminal F is connected with one end of a second battery charging negative cable 56. The other ends of the battery charging cables 54 and 56 include battery terminal clamps which are normally connected with the respective positive and negative terminals X and Y of a storage battery 58 to be charged.

Operation

In operation, with battery charging cables 54 and 56 respectively connected with the battery terminals X and Y, reed switches C and D will close and apply current to gates 38 and 40 and render SCR3 and SCR4 conductive. SCR3 and SCR4 rectify the transformer current so that terminal E is positive and terminal F is negative. Positive current will then flow through the battery via positive cable 54 from transformer T center tap E, leads 14 and 20, SCR3 and SCR4, conductor 16, lead 18 and negative cable 56. In this mode SCR1 and SCR2 remain non-conductive and block current in an opposite direction.

In the event negative cable 56 is connected to the positive terminal X and positive cable 54 is connected with the negative terminal Y of the battery 58, reed switches A and B will close and apply current to gates 22 and 24 and render SCR1 and SCR2 conductive. SCR1 and SCR2 then rectify the transformer current so that terminal Y is positive and terminal E is negative. Positive current will then flow through the battery via negative cable 56 from terminal F, lead 18, conductor 16, SCR1 and SCR2, leads 14 and 20, transformer T center tap E, and the positive cable 54. In this mode SCR3 and SCR4 remain non-conductive.

In the event the battery terminal clamps on the battery charging cables 54 and 56, when disconnected from the battery 58, are inadvertently placed in contact with each other, while the battery charger 10 is energized, no current will flow between the charging cable clamps for the reason the reed switches are open.

Obviously the invention is susceptible to changes or alterations without defeating its practicability. Therefore, I do not wish to be confined to the preferred embodiment shown in the drawings and described herein.

I claim:

1. In combination with a battery charger including a circuit for charging a rechargeable storage battery, said battery charger having a transformer including a center tapped secondary winding providing battery charging current at its respective ends and center tap, the improvement comprising:
    a battery polarity sensing circuit connected with the respective ends and center tap of the secondary winding;
    a first battery cable connected with the secondary winding center tap; and,
    a second battery cable connected with the ends of the secondary winding in series with the sensing circuit,
        said battery charging circuit including first and second normally open switch means in series with the battery cables and controlled by the sensing circuit,
        said first and second switch means each including at least one silicon controlled rectifier and a magnetic reed switch,
        said first or said second switch means being closed by battery residual potential to render said battery charging circuit conductive when said first and second battery cables are connected with the terminals of a battery to be charged.

2. The combination according to claim 1 in which the first switch means silicon controlled rectifier anode and cathode are respectively connected with said transformer secondary winding ends and said second battery cable and the terminals of the first switch means reed switch are respectively connected with said transformer secondary winding ends and the gate of the first switch means silicon controlled rectifier.

3. The combination according to claim 2 in which the second switch means silicon controlled rectifier anode and cathode are respectively connected with said second battery cable and said transformer secondary winding ends and the terminals of the second switch means reed switch are respectively connected with said second battery cable and the gate of the second switch means silicon controlled rectifier.

* * * * *